United States Patent
Zhou

(10) Patent No.: US 11,610,922 B2
(45) Date of Patent: Mar. 21, 2023

(54) ARRAY SUBSTRATE AND DISPLAY PANEL DESIGN IMPROVING APERTURE RATIO

(71) Applicant: SHENZHEN CHINA STAR OPTOELECTRONICS SEMICONDUCTOR DISPLAY TECHNOLOGY CO., LTD., Shenzhen (CN)

(72) Inventor: Xingyu Zhou, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 442 days.

(21) Appl. No.: 16/618,129

(22) PCT Filed: Aug. 29, 2019

(86) PCT No.: PCT/CN2019/103292
§ 371 (c)(1),
(2) Date: Nov. 28, 2019

(87) PCT Pub. No.: WO2021/022594
PCT Pub. Date: Feb. 11, 2021

(65) Prior Publication Data
US 2021/0358978 A1    Nov. 18, 2021

(30) Foreign Application Priority Data

Aug. 8, 2019  (CN) .......................... 201910729340.0

(51) Int. Cl.
*H01L 27/12* (2006.01)
*H01L 27/32* (2006.01)

(52) U.S. Cl.
CPC ...... *H01L 27/1255* (2013.01); *H01L 27/1259* (2013.01); *H01L 27/3265* (2013.01)

(58) Field of Classification Search
CPC ....................... H01L 27/1255; H01L 27/3265
See application file for complete search history.

(56) References Cited

U.S. PATENT DOCUMENTS

| 2006/0113549 A1* | 6/2006 | Den ................. H01L 29/66969 257/79 |
| 2016/0133682 A1 | 5/2016 | Kim et al. |
| 2016/0141349 A1 | 5/2016 | Yun et al. |
| 2016/0247869 A1 | 8/2016 | Li et al. |

(Continued)

FOREIGN PATENT DOCUMENTS

| CN | 105609528 A | 5/2016 |
| CN | 107808895 A | 3/2018 |
| CN | 109166896 A | 1/2019 |

*Primary Examiner* — Jay C Chang
*Assistant Examiner* — Mikka Liu
(74) *Attorney, Agent, or Firm* — PV IP PC; Wei Te Chung; Ude Lu

(57) ABSTRACT

An array substrate, a display panel, and a method of fabricating an array substrate are provided. The array substrate includes a display region and a non-display region. The array substrate further includes a substrate, a first transparent layer disposed on the substrate corresponding to the display region, an interlayer insulating layer disposed on the substrate, and a second transparent layer disposed on the interlayer insulating layer.

6 Claims, 6 Drawing Sheets

(56) References Cited

U.S. PATENT DOCUMENTS

| | | | |
|---|---|---|---|
| 2018/0122883 A1* | 5/2018 | Beak | H01L 27/3248 |
| 2019/0123121 A1 | 4/2019 | Liu et al. | |
| 2020/0106045 A1* | 4/2020 | Han | H01L 27/3258 |
| 2021/0183977 A1 | 6/2021 | Xiao et al. | |

* cited by examiner

ARRAY SUBSTRATE AND DISPLAY PANEL DESIGN IMPROVING APERTURE RATIO

FIELD OF INVENTION

The present invention relates to the field of array substrates, and in particular, to an array substrate, a display panel, and a method of fabricating the array substrate.

BACKGROUND OF INVENTION

Organic light-emitting diodes (OLEDs) have become the most promising new display devices in recent years due to their self-illumination, all-solid state, and high contrast ratio.

The higher the OLED aperture ratio, the higher the efficiency of light transmittance. When light is emitted through a backlight, not all light can pass through a panel, such as signal traces for an OLED source driver chip and a gate driver chip, and thin film transistors itself, as well as capacitor regions on the substrate, etc. These places are not completely transparent, and a ratio of an effective light-transmitting region to an entire area is called an aperture ratio.

In current OLED panels having a bottom-emitting structure, because a large number of patterns occupy a part of the area, improving the aperture ratio is greatly limited. As shown in FIG. 1, the conventional OLED panel includes a substrate 35, a first light-shielding layer 36 and a second light-shielding layer 30 disposed on the substrate 35, a buffer layer 37 disposed on the first light-shielding layer 36 and the second light-shielding layer 30, an interlayer insulating layer 38 overlaid on the buffer layer 37, a passivation layer 39 overlaid on the interlayer insulating layer 38, a planarization layer 40 disposed on the passivation layer 39, and a pixel definition layer 41 disposed on the planarization layer 40. Therebetween, a gate insulating layer 31, a gate electrode 32, and a composite film layer form a capacitor region of an array substrate, wherein the composite film layer consists of a copper film layer 34 and a molybdenum film layer 33, which are laminated. The capacitor region consists a metal material that is opaque, resulting in a reduction in the light-transmitting region and a reduction in the aperture ratio.

In view of this, how to increase the aperture ratio has become a key research topic for researchers or developers.

Technical Problem

At present, the OLED panels with the bottom-emitting structure have a problem that the aperture ratio is not high and an undercut is easily caused.

SUMMARY OF INVENTION

Technical Solution

In order to achieve the above objects, an embodiment of the present invention provides an array substrate including a display region and a non-display region, wherein the array substrate includes a substrate; a first transparent layer disposed on the substrate corresponding to the display region; an interlayer insulating layer disposed on the substrate; and a second transparent layer disposed on the interlayer insulating layer.

Furthermore, the substrate positioned in the non-display region is sequentially laminated with an active layer disposed on the substrate, wherein the active layer is disposed in a same layer as the first transparent layer; a gate insulating layer disposed on the active layer; and a gate disposed on the gate insulating layer; wherein the interlayer insulating layer includes at least two first contact holes disposed in the interlayer insulating layer.

Furthermore, the interlayer insulating layer disposed in the non-display region is further provided with a composite metal layer disposed on the interlayer insulating layer, the composite metal layer is partially disposed in the first contact hole, the composite metal layer includes a metal layer and a second transparent layer laminated, the second transparent layer disposed on the interlayer insulating layer, and the metal layer disposed on the second transparent layer.

Furthermore, the array substrate further includes a passivation layer disposed on the interlayer insulating layer and the composite metal layer; a planarization layer disposed on the passivation layer; a second contact hole penetrated the passivation layer and the planarization layer; a pixel electrode layer disposed on the planarization layer and connected to the metal layer through the second contact hole; and a pixel definition layer disposed on the planarization layer and partially covered on the pixel electrode layer.

Furthermore, the substrate includes a glass substrate; a light-shielding layer disposed on the glass substrate in the non-display region; and a buffer layer disposed on the light-shielding layer and the glass substrate.

An embodiment of the present invention further provides an organic light-emitting diode display panel including the above array substrate.

An embodiment of the present invention further provides a method of fabricating an array substrate, the array substrate including a display region and a non-display region, wherein the method includes steps of providing a substrate; depositing an oxide layer on the substrate and patterning the oxide layer to form an active layer and a first transparent layer disposed in a same layer; forming a gate insulating layer on the active layer; depositing a layer of metal on the gate insulating layer to form a gate layer; depositing and forming an interlayer insulating layer, the active layer, the gate insulating layer, the gate layer, and the first transparent layer on the substrate, and forming at least two first contact holes on the interlayer insulating layer; and depositing a composite metal layer on the interlayer insulating layer, the composite metal layer including a second transparent layer and a metal layer, and etching away the metal film of the composite metal layer positioned in the display region and retaining the second transparent layer.

Furthermore, in the step of providing the substrate, the method further includes providing a glass substrate; depositing a layer of metal on the glass substrate and patterning the layer of metal to form a light-shielding layer; and depositing a buffer layer on the light-shielding layer and the glass substrate.

Furthermore, after the step of depositing the composite metal layer and etching the composite metal layer, the method further includes depositing a passivation layer on the interlayer insulating layer and the composite metal layer; coating a photoresist layer on the passivation layer to form a planarization layer; forming a second contact hole by photolithography of the passivation layer and the planarization layer; and forming a pixel electrode layer on the planarization layer connected to the metal layer through the second contact hole.

Furthermore, the method further including forming a pixel definition layer on the planarization layer and the pixel electrode layer after the step of forming the pixel electrode layer.

Beneficial Effect

The array substrate, the display panel, and the method of fabricating the array substrate provided by the present invention have advantages that the number of photolithography process is not increased, a transparent capacitor region can transmit light, an aperture region is increased, and source and drain metal layer differ from the conventional structure. Therefore, there is no undercut problem, and risk of subsequent film peeling is reduced.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF EMBODIMENTS

Figure 1:
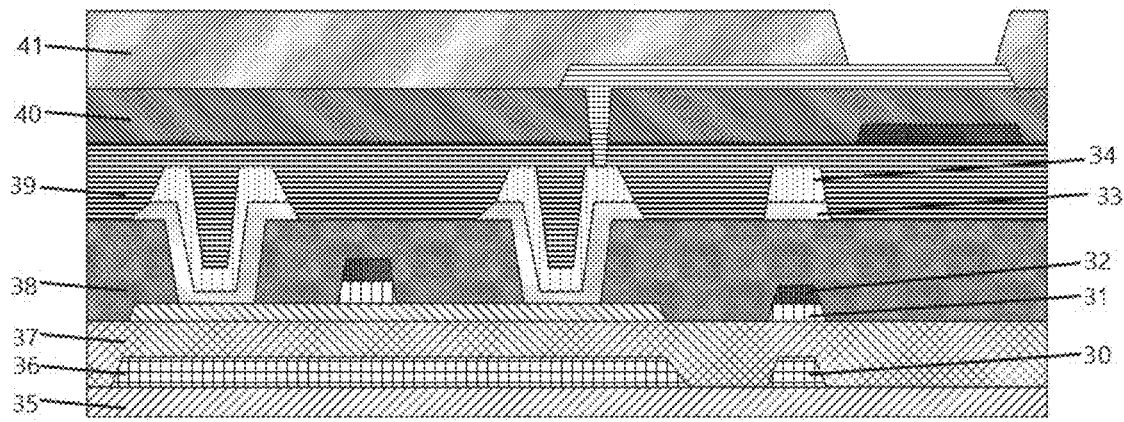
FIG. 1 is a schematic structural view of an array substrate in the conventional art.

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

In the description of the present invention, it is to be understood that the terms such as "center", "longitudinal", "transverse", "length", "width", "thickness", "upper", "lower", "front", "rear", "left", "right", "vertical", "horizontal", "top", "bottom", "inside", "outside", "clockwise", "counterclockwise", etc., the orientation or positional relationship of the indications is based on the orientation or positional relationship shown in the drawings, and is merely for the convenience of the description of the invention and the simplified description, rather than indicating or implying that the device or component referred to has a specific orientation, in a specific orientation. The construction and operation are therefore not to be construed as limiting the invention.

In addition, unless otherwise defined, any technical or scientific term used herein shall have the common meaning understood by a person of ordinary skills. Such words as "first" and "second" used in the specification and claims are merely used to differentiate different components rather than to represent any order, number or importance. In the description of the present invention, the meaning of "plurality" is two or more unless specifically defined otherwise.

This embodiment will be described from the perspective of an array substrate, which can be integrated in a display panel. The display panel is applied to a mobile terminal, and the mobile terminal can include a mobile phone, a tablet computer, or the like.

Figure 2:
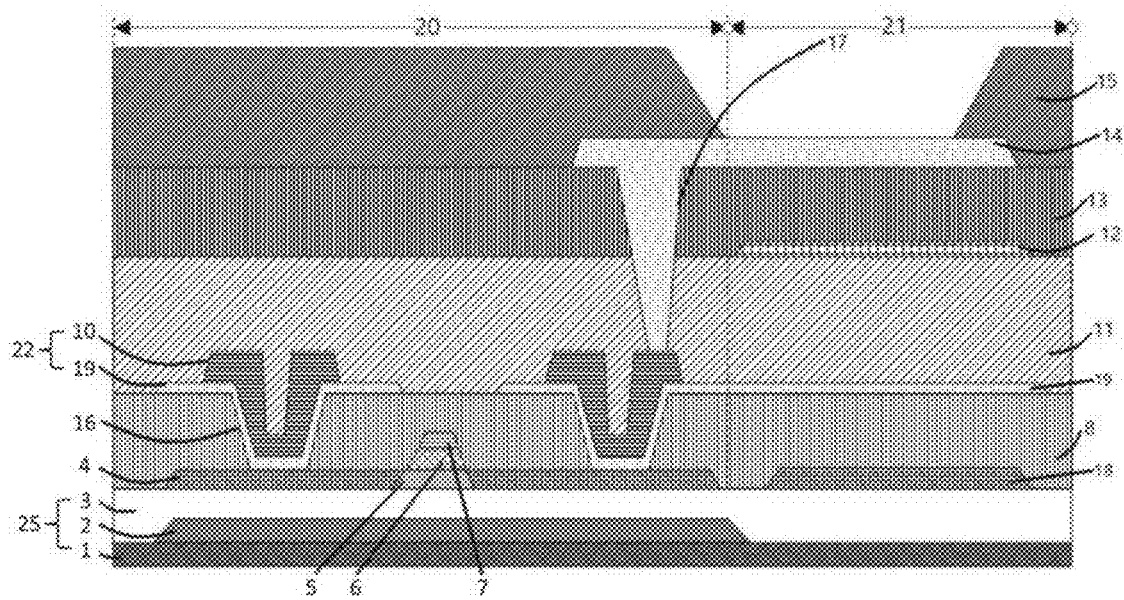
FIG. 2 is a schematic structural diagram of an array substrate according to an embodiment of the present invention.

As shown in FIG. 2, the array substrate includes a display region 21 and a non-display region 20. The display region 21 is a light-transmitting region of the array substrate, and the non-display region 20 has an opaque film layer. Therefore, the non-display region cannot be completely transparent.

The array substrate further includes a substrate 25, a first transparent layer 18, an interlayer insulating layer 8, and a second transparent layer 19. The first transparent layer 18 is disposed on the substrate 25 on the display region 21. The interlayer insulating layer 8 is overlaid on the substrate 25. The second transparent layer 19 is disposed on the interlayer insulating layer 8.

The structure of each film layer of the array substrate will be further described below.

Figure 5A:
FIG. 5A is a schematic structural diagram of the array substrate according to an embodiment of the present invention.

The substrate 25 includes a glass substrate 1, a light-shielding layer 2, and a buffer layer 3. Specifically, as shown in FIG. 5A, the light-shielding layer 2 and the buffer layer 3 are laminated on the glass substrate 1, and the buffer layer 3 is provided on the light-shielding layer 2.

The light-shielding layer 2 has a thickness of about 500 to 10,000 angstroms and is made of a metal material such as molybdenum (Mo), aluminum (Al), copper (Cu), titanium (Ti), or the like, or an alloy. In the process of fabricating the light-shielding layer 2, the light-shielding layer needs to be patterned by subjected to a photolithography procedure. A material of the buffer layer 3 can be silicon oxide (SiOx) or silicon nitride (SiNx), or a multilayer structure consisting of SiOx and SiOx, and the buffer layer 3 has a thickness of about 1000 to 5000 angstroms.

Figure 5B:
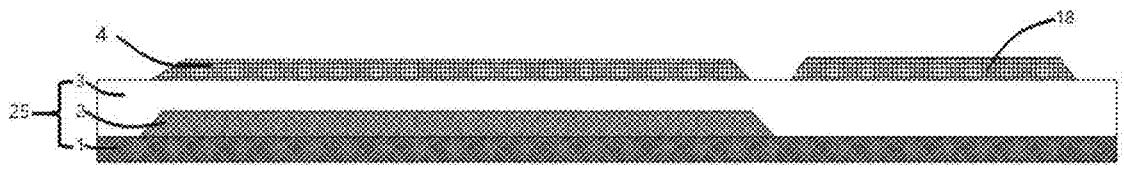
FIG. 5B is a schematic structural diagram of an active layer deposited on the array substrate according to the embodiment of the present invention.

As shown in FIG. 5B, in this embodiment, an oxide layer is deposited on the buffer layer 3. A material of the oxide can be indium gallium zinc oxide (IGZO), indium zinc tin oxide (IZTO), or indium gallium zinc tin oxide (IGZTO), etc., and a thickness of the oxide layer ranges from about 100 to 1000 angstroms. In the process of fabricating the oxide layer, the oxide layer is subjected to photolithography procedure to form an active layer 4 and a first transparent layer 18 in a same layer, the active layer 4 is positioned in the non-display region 20, and the first transparent layer 18 is positioned in the display region 21.

Figure 5C:
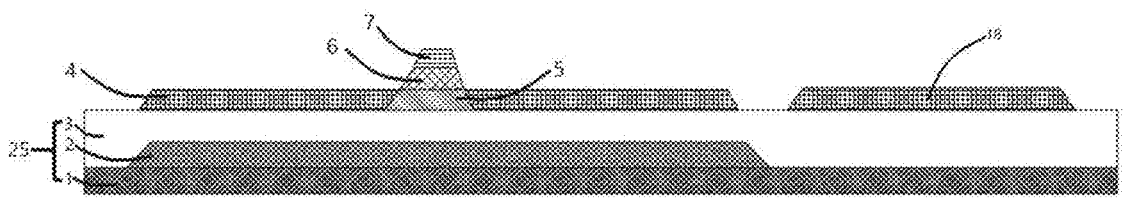
FIG. 5C is a schematic structural diagram of a gate and a gate insulating layer disposed on the array substrate according to the embodiment of the present invention.

As shown in FIG. 5C, a gate insulating layer 6 is disposed on the active layer 4, and a gate layer 7 is disposed on the gate insulating layer 6.

A material of the gate insulating layer 6 is SiOx or SiNx, or a multilayer structure consisting of SiOx and SiOx, and a thickness of the gate layer ranges from about 1000 to 3000 angstroms. A material of the gate layer 7 can be Mo, Al, Cu, Ti, etc., or alloy, and a thickness of the gate layer ranges from about 2000 to 10000 angstroms (Å).

Figure 5D:
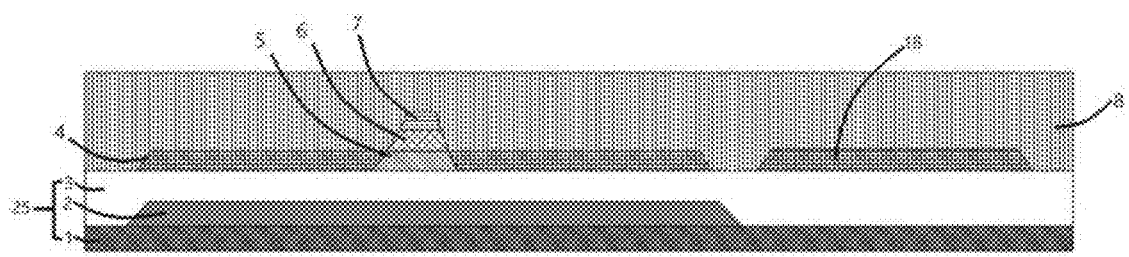
FIG. 5D is a schematic structural diagram of an interlayer insulating layer disposed on the array substrate according to the embodiment of the present invention.

As shown in FIG. 5D, the active layer 4 and the buffer layer 3 are covered with an interlayer insulating layer (IDL) 8, and a material of the interlayer insulating layer 8 is SiOx or SiNx, or a multilayer structure consisting of SiOx and SiOx having a thickness of about 2000 Å to 10,000 Å, and then performing photolithography and etching procedures on the interlayer insulating layer 8 to form a first contact hole 16, wherein the first contact hole 16 is positioned at the non-display region 20.

Figure 5E:
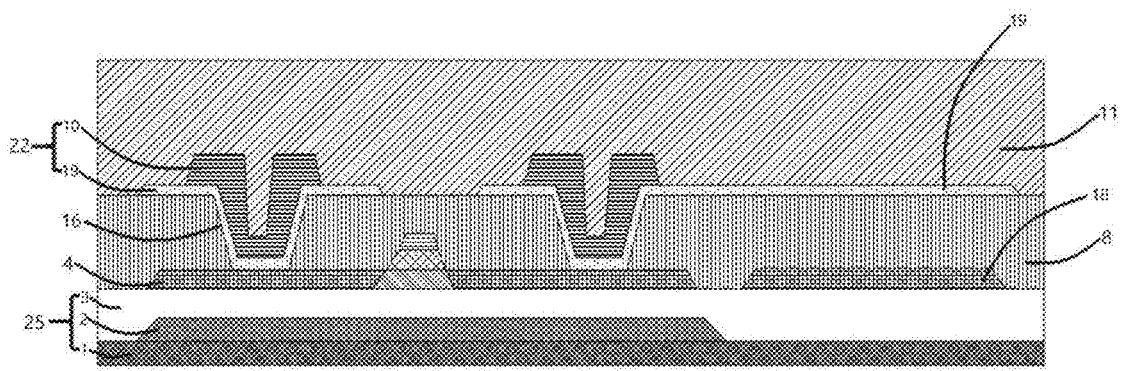
FIG. 5E is a schematic structural diagram of a source and a drain, and a passivation layer deposited on the array substrate according to the embodiment of the present invention.

As shown in FIG. 5E, a composite metal layer 22 is disposed on the interlayer insulating layer 8, and the composite metal layer 22 includes a metal layer 10 and a second transparent layer 19, the second transparent layer 19 is disposed on the interlayer insulating layer 8, and the metal layer 10 is disposed on the second transparent layer 19. In this embodiment of the present invention, the metal layer 10 in the composite metal layer 22 is made of a copper material, and the second transparent layer 19 is made of an indium tin oxide material, wherein a thickness of the indium tin oxide material is about 200 to 2000 angstroms, and a thickness of the copper material is about 3000 to 10,000 angstroms. Of course, partially in other embodiments, the material of the metal layer 10 includes, but is not limited to copper, such as aluminum. The material of the second transparent layer 19 includes, but is not limited to indium tin oxide, such as indium gallium zinc oxide.

The metal film layer 10 is etched away in a portion corresponding to the display region 21, retaining only the second transparent film layer 19, and the composite metal film layer 22 in the non-display region 20 is provided as a source and a drain. Compared with a structure of ab array substrate in the conventional art as shown in FIG. 1, the capacitor region formed by the first transparent layer 18 and the second transparent layer 19 in this embodiment of the present invention is completely transparent. Therefore, the aperture ratio is significantly increased as compared with the conventional art.

The interlayer insulating layer 8 and the composite metal layer 22 are further covered by a passivation layer 11 made of SiOx or SiNx or a multilayer structure consisting of SiOx and SiOx, and a thickness of the interlayer insulating layer ranges from about 1000 to 5000 angstroms. Compared with a composite metal layer (such as a copper film layer and a molybdenum film layer shown in FIG. 1) in the conventional art, in this embodiment of the present invention, since the metal layer 10 is directly disposed on the second transparent layer 19, a lower layer of the composite metal layer 22 has only the second transparent layer 19, and the metal layer 10 serves as the source and drain. Therefore, there is no problem of undercut during etching, so that the composite metal layer 22 is more flatten, and risk of peeling is related less during deposition of the passivation layer 11.

Figure 5F:
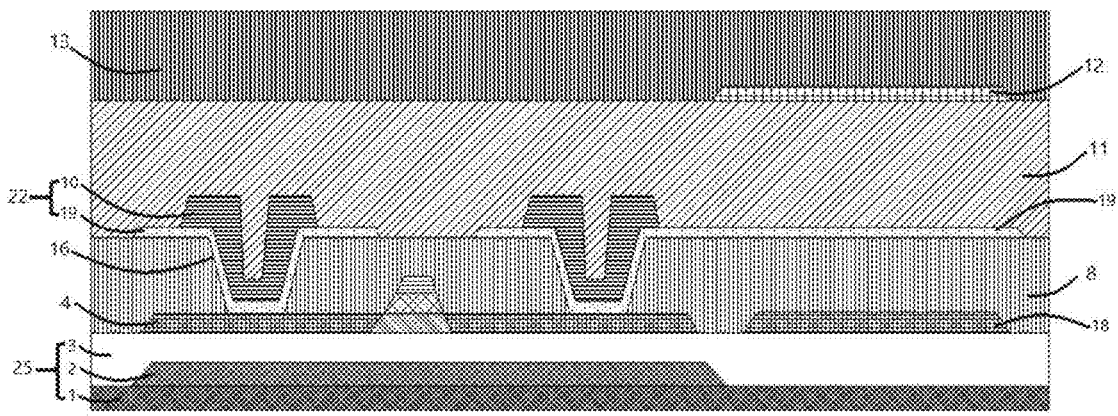
FIG. 5F is a schematic structural diagram of a planarization layer disposed on the array substrate according to the embodiment of the present invention.
Figure 5G:
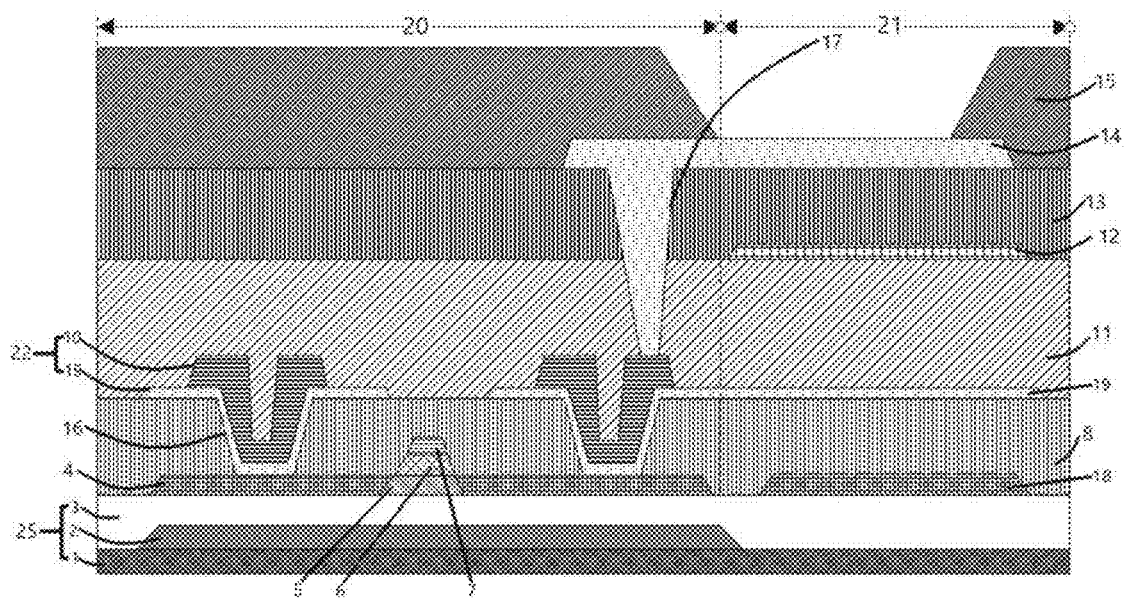
FIG. 5G is a schematic structural diagram of a pixel electrode layer and a pixel definition layer formed on the array substrate according to the embodiment of the present invention.

As shown in FIGS. 5F and 5G, a planarization layer 13 is disposed on the passivation layer 11, a pixel electrode layer 14 is disposed on the planarization layer 13, and a second contact hole 17 is further provided in the passivation layer 11 and the planarization layer 13. A pixel layer 12 is further disposed on the passivation layer 11, and the pixel electrode layer 14 is connected to the metal layer 10 through the second contact hole 17. A pixel definition layer 15 is further disposed on the planarization layer 13.

The planarization layer 13 has a thickness of about 0.5 to 5 micrometer (um), which is made of a photoresist material, and a thickness of the pixel electrode layer 14 ranges from about 500 to 2000 angstroms.

Figure 6:
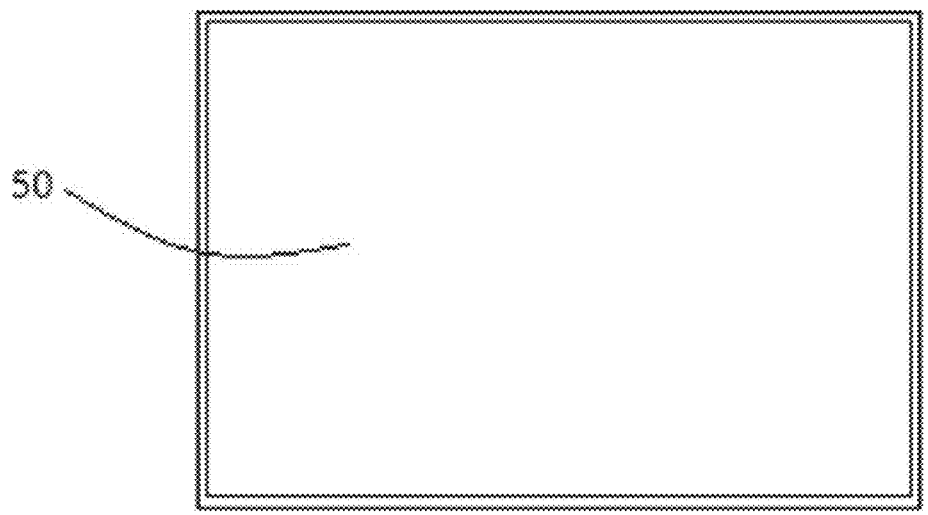
FIG. 6 is a schematic structural diagram of a display panel according to an embodiment of the present invention.

As shown in FIG. 6, in one embodiment of the present invention, a display panel 50 including an array substrate as the array substrate described in the above embodiments is provided. The specific structure of the array substrate is as described above, and details are not described herein again.

In addition, the present invention further provides a display device including the display panel 50 of the above embodiment, wherein the display device can be a liquid crystal television (TV), a liquid crystal display device (such as a flexible display, a high efficient display), a mobile phone, a digital photo frame, a tablet computer, any product or component that has a display function.

Figure 3:
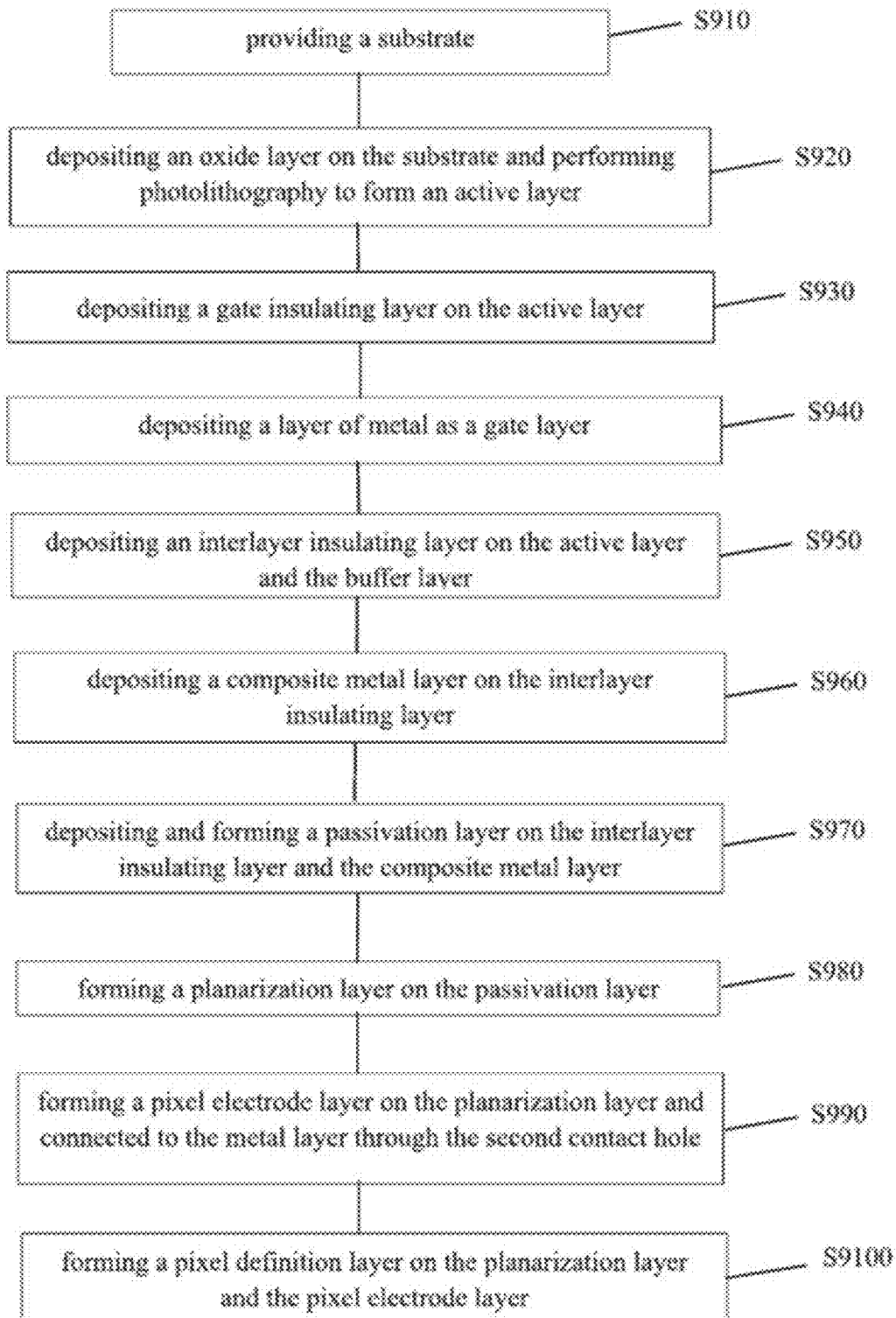
FIG. 3 is a flowchart showing a method of fabricating the array substrate according to an embodiment of the present invention.

According to another aspect of the present invention, there is also provided a method of fabricating an array substrate, as shown in FIG. 3, including the following steps.

Referring to FIG. 5A,

A step S910, providing a substrate 25.

Figure 4:
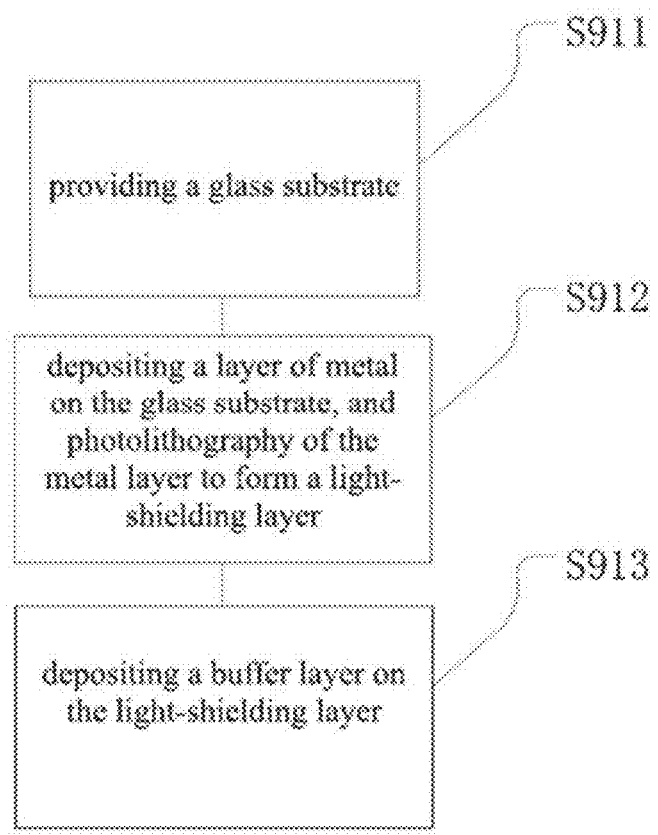
FIG. 4 is a flowchart showing the steps of providing a substrate according to the embodiment of the present invention shown in FIG. 3.

Referring to FIG. 4, the following steps are further included in the step S910.

A step S911, providing a glass substrate 1.

A step S912, depositing a layer of metal on the glass substrate 1, and photolithography of the metal layer to form a light-shielding layer 2.

In this step, a metal having a thickness of about 500 Å to 10000 Å is deposited as the light-shielding layer 2, and a material of the light-shielding layer 2 can be Mo, Al, Cu, Ti, or the like, or an alloy. The metal is patterned by subjected to a photolithography procedure, and the light-shielding layer 2 is formed.

A step S913, depositing a buffer layer 3 on the light-shielding layer 2.

In this step, a layer of silicon oxide (SiOx) or silicon nitride (SiNx), or a multilayer structure consisting of SiOx and SiOx is deposited as the buffer layer 3, and a thickness of the buffer layer 3 ranges from about 1000 Å to 5000 Å.

With continued reference to FIG. 3, and combined with FIG. 5B, a step S920, depositing an oxide layer on the substrate 25 and performing photolithography to form an active layer 4.

In this step, an oxide material is deposited, which can be indium gallium zinc oxide (IGZO), indium zinc tin oxide (IZTO), indium gallium zinc tin oxide (IGZTO), or the like, and a thickness of the oxide layer ranges from about 100 to 1000 angstroms. The oxide layer is subjected to photolithography procedure to form the active layer 4 and a first transparent layer 18 in a same layer.

Referring to FIG. 5C, a step S930, depositing a gate insulating layer 6 on the active layer 4.

A step S940, depositing a layer of metal as a gate layer 7.

In this step, a material of the gate layer 7 can be Mo, Al, Cu, Ti, etc., or an alloy, having a thickness of about 2000 to 10000 angstroms.

Therebetween, a pattern of the gate layer 7 is etched first by using a photolithography. The gate insulating layer 6 is then etched using the pattern of the gate layer 7 for self-alignment. The gate insulating layer 6 is only present under the gate layer 7, and the gate insulating layer 6 at the remaining positions is etched away. After a plasma treatment of the active layer 4, a portion of the active layer 4 not protected by the gate layer 7 and the gate insulating layer 6 is subjected to the plasma treatment, a resistance of that region is remarkably lowered to form an N+ conductor layer, and a portion of the active layer (such as a region beneath the gate insulating layer) protected by the gate insulating layer 6 is not treated by plasma that region maintains semiconductor characteristics as a channel 5.

Referring to FIG. 5D, a step S950, depositing an interlayer insulating layer 8 on the active layer 4 and the buffer layer 3.

Meanwhile, the interlayer insulating layer 8 is made of SiOx or SiNx, or a multilayer structure consisting of SiOx and SiOx, having a thickness of about 2000 Å to 10000 Å, and performing photolithography and etching procedures on the interlayer insulating layer 8 to form a first contact hole 16.

Referring to FIG. 5E,

A step S960, depositing a composite metal layer 22 on the interlayer insulating layer.

In this embodiment, the composite metal layer 22 includes an indium tin oxide (ITO) layer and a copper (Cu) layer which are laminated, and a thickness of the indium tin oxide layer (that is, the second transparent layer 19) is about 200 Å to 2000 Å, a thickness of the copper layer (that is, the metal layer 10) is about 3000 Å to 10000 Å. When the photolithography process is performed using a halftone mask in the non-display region, etching is performed by copper acid and oxalic acid to define a pattern. Then, the photoresist is thinned, the photoresist is retained only at the position where the copper film layer is needed, and then a copper acid etching is performed again. The display region 21 has only the second transparent layer 19, and the rest is the composite metal film layer 22 (that is, a laminated structure of the indium tin oxide layer and the copper layer). Therefore, the composite metal layer 22 is formed by only photolithography process with a halftone mask, and the number of the photolithography process is not increased.

A step S970, depositing and forming a passivation layer 11 on the interlayer insulating layer 8 and the composite metal layer 22.

Therebetween, a material of the passivation layer is SiOx or SiNx, or a multilayer structure consisting of SiOx and SiOx, and has a thickness of about 1000 to 5000 angstroms.

A step S980, forming a planarization layer 13 on the passivation layer 11.

The planarization layer 11 has a thickness of 0.5 to 5 um, which is made of a photoresist material, and the planarization layer 11 is treated by photolithography to form a second contact hole 17.

Referring to FIG. 5F, a step S990, forming a pixel electrode layer 14 on the planarization layer 11, and the pixel electrode layer 14 connected to the metal layer through the second contact hole 17.

The pixel electrode layer 14 has a thickness of about 500 to 2000 angstroms.

Referring to FIG. 5G, a step S9100, forming a pixel definition layer 15 on the planarization layer 11 and the pixel electrode layer 14.

In this step, the pixel definition layer 15 is fabricated and an aperture region is defined.

The array substrate, the display panel, and the method of fabricating an array substrate provided by the present invention have advantages that the number of photolithography process is not increased, a transparent capacitor region can transmit light, an aperture region is increased, and source and drain metal layer differ from the conventional structure. Therefore, there is no undercut problem, and risk of subsequent film peeling is reduced.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An array substrate, comprising a display region and a non-display region, wherein the array substrate comprises:
a substrate;
a first transparent layer disposed on the substrate corresponding to the display region;
an interlayer insulating layer disposed on the substrate;
a second transparent layer disposed on the interlayer insulating layer;
a passivation layer disposed on the interlayer insulating layer;
a planarization layer disposed on the passivation layer;
a second contact hole penetrated through the passivation layer and the planarization layer;
a pixel electrode layer disposed on the planarization layer and connected to a metal layer through the second contact hole; and
a pixel definition layer disposed on the planarization layer and partially covered on the pixel electrode layer;
wherein the substrate positioned in the non-display region is sequentially laminated with:
an active layer disposed on the substrate, wherein the active layer is disposed in a same layer as the first transparent layer;
a gate insulating layer disposed on the active layer; and
a gate disposed on the gate insulating layer;
wherein the interlayer insulating layer comprises at least two first contact holes disposed in the interlayer insulating layer.

2. The array substrate according to claim 1, wherein the interlayer insulating layer disposed in the non-display region is further provided with a composite metal layer disposed on the interlayer insulating layer, the composite metal layer is partially disposed in the first contact hole, the composite metal layer comprises the metal layer and a second transparent layer laminated, the second transparent layer disposed on the interlayer insulating layer, and the metal layer disposed on the second transparent layer.

3. The array substrate according to claim 2, wherein the passivation layer is disposed on the composite metal layer.

4. The array substrate according to claim 1, wherein the substrate comprises:
a glass substrate;
a light-shielding layer disposed on the glass substrate in the non-display region; and
a buffer layer disposed on the light-shielding layer and the glass substrate.

5. An organic light-emitting diode display panel, comprising an array substrate as claimed in claim 1.

6. An array substrate, comprising a display region and a non-display region, wherein the array substrate comprises:
a substrate comprising:
a glass substrate;

a light-shielding layer disposed on the glass substrate in the non-display region; and a buffer layer disposed on the light-shielding layer and the glass substrate;

a first transparent layer disposed on the substrate corresponding to the display region;

an interlayer insulating layer disposed on the substrate;

a second transparent layer disposed on the interlayer insulating layer;

a passivation layer disposed on the interlayer insulating layer;

a planarization layer disposed on the passivation layer;

a second contact hole penetrated through the passivation layer and the planarization layer;

a pixel electrode layer disposed on the planarization layer and connected to a metal layer through the second contact hole; and a pixel definition layer disposed on the planarization layer and partially covered on the pixel electrode layer.

\* \* \* \* \*